(12) United States Patent
Zurcher et al.

(10) Patent No.: US 6,500,724 B1
(45) Date of Patent: Dec. 31, 2002

(54) METHOD OF MAKING SEMICONDUCTOR DEVICE HAVING PASSIVE ELEMENTS INCLUDING FORMING CAPACITOR ELECTRODE AND RESISTOR FROM SAME LAYER OF MATERIAL

(75) Inventors: Peter Zurcher, Phoenix, AZ (US); Melvy Freeland Miller, III, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 57 days.

(21) Appl. No.: 09/642,680

(22) Filed: Aug. 21, 2000

(51) Int. Cl.[7] .............................................. H01L 21/20
(52) U.S. Cl. ........................ 438/384; 438/238; 438/381; 438/382; 438/393
(58) Field of Search ............................ 438/3, 238, 381, 438/382, 384, 393, 687, 957, 239, 329, 330, 250, 253, 396

(56) References Cited

U.S. PATENT DOCUMENTS

| | | | |
|---|---|---|---|
| 5,053,917 A | 10/1991 | Miyasaka et al. | 361/321 |
| 5,356,826 A * | 10/1994 | Natsume | 148/DIG. 136 |
| 5,440,174 A | 8/1995 | Nishitsuji | |
| 5,708,559 A * | 1/1998 | Brabazon et al. | 257/301 |
| 5,801,065 A | 9/1998 | Rizvi et al. | |
| 5,851,870 A | 12/1998 | Alugbin et al. | 438/239 |
| 5,912,044 A | 6/1999 | Farooq et al. | 427/79 |
| 5,985,731 A | 11/1999 | Weng et al. | 438/396 |
| 6,117,747 A | 9/2000 | Shao et al. | 438/396 |
| 6,180,976 B1 | 1/2001 | Roy | 257/306 |
| 6,207,560 B1 * | 3/2001 | Lee | 438/618 |
| 6,259,128 B1 * | 7/2001 | Adler et al. | 257/296 |

FOREIGN PATENT DOCUMENTS

| | | |
|---|---|---|
| EP | 1 020 905 A1 | 7/2000 |
| JP | 10303372 | 11/1998 |
| WO | WO 01/56086 A1 | 8/2001 |

OTHER PUBLICATIONS

Zurcher, Peter et al.; "Integration Of Thin Film MIM Capacitors And Resistors Into Copper Metallization Based RF–CMOs And BI–CMOs Technologies;" International Electron Devices Meeting 2000; IEDM; Technical Digest; San Francisco, CA; Dec. 10–13, 2000; New York, NY: IEEE, US, 10 Dec. 10, 2000, pp. 153–156.

\* cited by examiner

*Primary Examiner*—Matthew Smith
*Assistant Examiner*—Craig P. Lytle

(57) ABSTRACT

A semiconductor device and a method of making a semiconductor device. A damascene metal layer (16) is formed in an insulating dielectric layer (12), which is in direct electrical communication with a substrate (10). A layer of a passive element, such as first capacitor electrode layer (20) is disposed on metal layer (16) and preferably is offset relative to metal layer (16) to allow a direct electrical interconnect through a via (36) to metal layer (16). In one embodiment a capacitor and a resistor are formed as passive elements in the device. In another embodiment, the passive element includes at least one resistor (28) and optionally a second resistor (32). In yet another embodiment, metal layer (16) is a damascene copper layer.

22 Claims, 1 Drawing Sheet

METHOD OF MAKING SEMICONDUCTOR DEVICE HAVING PASSIVE ELEMENTS INCLUDING FORMING CAPACITOR ELECTRODE AND RESISTOR FROM SAME LAYER OF MATERIAL

The present invention is directed to a semiconductor device and method for forming a semiconductor device, and particularly, a semiconductor device, including at least one passive element, adapted for use in wireless communication systems.

Many electronic devices currently suffer design and resulting performance limitations in view of the state of semiconductor device fabrication technology. Wireless communication systems, for example, generally contain relatively few semiconductor chips, but several hundred passive elements. As efforts continue to enhance form factor and power reduction, and to improve performance and functionality at frequencies on the order of $10^9$ Hz or higher, it has become desirable to integrate passive elements into separate chips or modules and onto active substrates (such as silicon-containing substrates).

A variety of on-chip capacitor and resistor technologies currently exist, examples of which include double-poly, gate-oxide or junction capacitors or diffused silicon or poly silicon resistors. Many applications would benefit from an improvement in performance characteristics resulting from these technologies. For example, improvement is sought in the areas of reducing parasitic capacitance, improving voltage linearity, reducing electrode series resistance or reducing 1/f noise. It is also desired that resulting devices be integrated into the backend of an active substrate (e.g., Si-chip), heretofore not accomplished using existing technology.

DETAILED DESCRIPTION OF THE DRAWINGS

Figure 1:
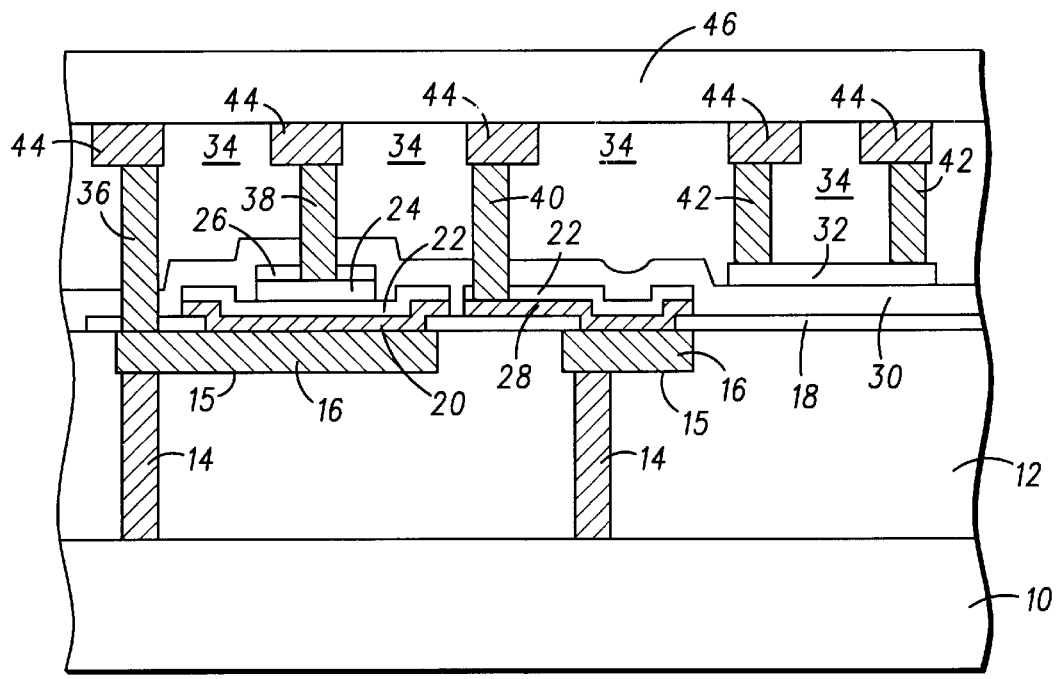
FIG. 1 illustrates one preferred semiconductor device fabricated in accordance with the present invention.

Referring to the FIG. 1, there is shown an example of a combination of semiconductor passive elements, such as a metal-insulator-metal capacitor or a thin film resistor. In the preferred embodiment, as illustrated in FIG. 1, the invention contemplates a device incorporating the combination of a metal-insulator-metal capacitor and at least one thin film resistor. FIG. 1 also illustrates an embodiment incorporating two thin film resistors. In another embodiment, it is contemplated that the metal-insulator-metal capacitor (or another passive element) may be omitted, or employed in a separate device, which may be in electrical communication with one or a plurality of resistor elements prepared in accordance with the method of the present invention.

In general, the devices of the present invention are characterized by the inclusion of a metal layer that is deposited in a trench formed in a layer of dielectric (i.e., insulating layer) and thereafter treated to remove excess material so that the resulting exposed surface of metal layer is substantially coplanar with the first surface of the layer of dielectric. Metal layer preferably is silver, gold, copper, aluminum or a mixture thereof, with copper being the preferred metal. Thus, more specifically, the devices are characterized by the inclusion of at least one copper damascene metal layer formed in a layer of material. In the preferred embodiment, the electrode for the capacitor is formed from a single damascene copper layer that becomes a terminal for one or more capacitors, resistors or a combination of both. However, the skilled artisan will recognize that a single passive element can be formed on a plurality of damascene layers, a single passive element can be formed on a single damascene layer, or one or more passive elements can be formed on multiple damascene layers.

To further illustrate, FIG. 1. depicts a device that includes a suitable semiconductor substrate 10. Adjoining the substrate 10 is a first insulating dielectric layer 12, with a trench 15 defined therein. At a surface defining the base of trench 15, a via 14 includes a material that conductively connects substrate 10 with a metal layer 16 that fills trench 15 (preferably a damascene metal layer, and still more preferably a damascene copper layer). Shown in FIG. 1 there is an optional barrier dielectric layer 18 formed over metal layer 16 that may be omitted over some or all of metal layer 16. For instance, FIG. 1 illustrates a window opening in barrier dielectric layer 18, exposing a portion of metal layer 16 and thereby affording direct contact between metal layer 16 and a first or bottom capacitor electrode layer 20. Metal layer 16 is shown continuous but may be broken into multiple parts. It should be noted that multiple capacitors may be built on single metal layer 16.

Capacitor electrode layer 20 is sandwiched over at least a portion of its length between metal layer 16 and a capacitor dielectric layer 22. A second or top capacitor electrode layer 24 adjoins at least a portion of capacitor dielectric layer 22. The second capacitor electrode layer 24 optionally may include an etch stop layer 26 over at least a portion of its surface. The combination of capacitor electrode layer 20, capacitor dielectric layer 22, and capacitor electrode layer 24 and optional etch stop layer 26 defines generally the structure of a capacitor element of the present invention.

A first resistor 28, preferably a thin film resistor, is formed from a suitable material that preferably (in an embodiment in which a metal-insulator-metal capacitor is employed) uses the same material as first capacitor electrode layer 20. Thus, resistor 28 and first capacitor electrode layer 20 are formed of a common material. First resistor 28 adjoins the first insulating dielectric layer 12, either in direct contact or separated therefrom over at least a portion of its surface by the optional barrier dielectric layer 18. Resistor 28 can be contacted through via 40 and metal layer 44 from above or optionally contacted through metal layer 16 and via 14. It should be noted that only one via 14 is needed when metal layers 16 are continuous. Optionally one or more dielectric layers are disposed on first resistor 28. For instance, in FIG. 1 there is shown a first interlevel dielectric layer 30 deposed as a blanket layer above metal layers 20 and 24 of the capacitor, and further deposed on optional etch stop layer 26 if used.

An optional second resistor 32 in direct contact with a surface of interlevel dielectric layer 30 is shown in FIG. 1. The second resistor may be employed elsewhere in the device and in contact with other layers. For instance, it may be disposed in direct contacting relationship with the same metal layer that is in direct contact with the first resistor. Another interlevel dielectric layer 34 is disposed on interlevel dielectric layer 30, covering optional second resistor 32 as shown in FIG. 1. As previously mentioned, either of the interlevel dielectric layers 30 or 34 may be omitted in favor of a single dielectric layer. Resistors 28 and 32 may be formed from different materials, and therefore, the resistivities of the resistors may be different.

A plurality of vias provide contact paths between metal layers that are separated by the second interlevel dielectric layer 34 and any other layers, if present. For instance, a via 36 includes a material that conductively connects a metal layer 44 to metal layer 16. One or more vias 38 include a material that conductively connects metal layer 44 to capacitor electrode layer 24. A plurality of vias 40 are filled with a material that conductively connects metal layer 44 to the first resistor 28. Likewise, a plurality of vias 42 include a material that conductively connects metal layer 44 to second resistor 32. Optionally, one or more additional layers such as, for example, a layer 46 may be disposed on metal layer 44. The embodiment illustrated in FIG. 1 depicts vias 38, 40 and 42 contacting the passive elements at the surface closest to metal layer 44. It will be appreciated that vias 36, 38 and 40 pass through interlevel dielectric layers 30 and 34 while via 42 passes only through interlevel dielectric layer 34.

While the skilled artisan will recognize that any of a variety of materials may be suitably employed to fabricate the passive elements, preferred dielectric materials for the capacitor dielectric layer material are selected from oxides or nitrides such as, for example, $Ta_2O_5$, $SrTiO_3$, $ZrO_2$, $ZrSiO_4$, $HfO_2$, $HfSiO_4$, $TiO_2$, $Si_3N_4$ or mixtures thereof stoichiometric variations of each of these materials. Preferred materials for the resistor and capacitor electrode layers include, for instance, intermetallics such as TaN, TaAlN, TiN, CrNi, WN, CrSi or mixtures thereof. Stoichiometric variations of these materials may also be employed.

It may be desirable that, as to at least one of the passive elements formed in the semiconductor device, metal layer 16 extends beyond or is offset laterally relative to the ends of the element. For example, metal layer 16 extends laterally beyond the ends of the first capacitor electrode layer 20, the first capacitor dielectric layer 22, and the second capacitor electrode layer 24. In this manner, electrical connection may be made to first capacitor electrode layer 20 of the device directly from metal layer 44 by way of via 36 and metal layer 16. Alternatively, with reference to the resistors 28 and 32, contact between layers may be direct through vias 40 and 42 to the first surface of the resistors.

By reference to the device illustrated in the FIG. 1, the processing of the passive devices on semiconductor substrate 10 is described. The first insulating dielectric layer 12 deposited on the substrate 10 is patterned and etched to form the trench 15 and via 14 for receiving metal layer 16 of the passive device. A low resistivity or highly conductive material is deposited in trench 15 and via 14. After depositing the material in trench 15, excess material is removed so that the exposed surface of the resulting metal layer 16 is continuous relative to the exposed surface of the first insulating dielectric layer 12, and preferably substantially coplanar therewith. Any suitable technique may be used for material removal, such as a chemical mechanical polishing technique.

Optionally, if barrier dielectric layer 18 is employed, it is deposited on the insulating dielectric layer 12 and metal layer 16 and then an opening is etched through it to expose at least a portion of metal layer 16 for the capacitor depicted in FIG. 1. A passive element is constructed on the metal layer by depositing material over barrier dielectric layer 18 (if used, or otherwise over the first insulating dielectric layer 12 and metal layer 16) that is then patterned and etched. Referring to FIG. 1, the patterning and etching steps or a chemical mechanical polishing procedure defines capacitor electrode 20 and resistor 28.

One or more additional deposition, patterning and etching steps are employed as needed to define additional components or layers of the passive elements, including (for an embodiment such as depicted in FIG. 1, wherein a capacitor is formed) the formation of capacitor dielectric layer 22 and metal layer 24. The skilled artisan will appreciate the variety of different techniques available to form the additional layers. Blanket deposition techniques may be used followed by one or more patterning and etching steps. In one embodiment, before etching, an optional second barrier or etch stop layer 26 is deposited over metal layer 24.

To prepare the resulting structure of the capacitor illustrated in FIG. 1, as few as one masking steps (with attendant etching) may be employed. It should be noted that if optional barrier layer 18 is used, then an optional masking step defines a window that exposes metal layer 16. The first masking step defines the second capacitor electrode layer 24 and an optional second resistor using the second electrode material. The second masking step defines the first capacitor electrode layer 20 and the first resistor 28 when a combination of resistor and capacitor is employed. It will be appreciated by the skilled artisan that it is possible, using the above described etching sequence, to leave at least a thin layer of dielectric material on the passive elements to help control the attack of etchant on the passive elements (particularly during via etching steps). Alternatively, should it be desired to etch straight through to the passive element, having such thin layer of dielectric can be avoided.

After formation of one or more passive elements, additional layers of material can be formed over each passive element as desired. For instance, the first and second interlevel dielectric layers 30 and 34 can be deposited (e.g., blanket deposited). If a second resistor 32 is formed, then it is deposited before the deposition of the second interlevel dielectric layer 34. The second resistor 32 is then defined using a suitable masking and etching sequence.

The vias are generated using any suitable technique (with etching being a preferred material removal technique), followed by the deposition of a conductive material. The interconnect metal layers may be formed in any suitable manner, including techniques such as the process for forming metal layer 16. It will be appreciated that metal layer 44 need not be formed in a damascene manner but can be formed in any other suitable manner. Additional layers or components (schematically depicted as layer 46) can be formed on the dielectric layer 34 and metal layer 44, with appropriate electrical communication paths (not shown) defined as desired.

The above methods generally include a plurality of steps of providing one or more materials and patterning the materials to form functional component layers of the resulting device. Patterning may employ any of a number of conventional steps, including material deposition or formation steps and material removal steps. Typically the steps involve the application of a photoresist to an exposed surface of a work layer, followed by a photolithography step to develop the photoresist, with resulting selective removal of the photoresist that defines a predetermined pattern on the exposed surface of the work layer. The exposed surface on the work layer is then etched as desired to remove material at and beneath the surface. Photoresist remains selectively attached to the work piece as a protective layer, i.e., as a layer to prevent the agent (e.g., etchant) employed for material removal from contacting the underlying material of the work piece.

Figure 2:
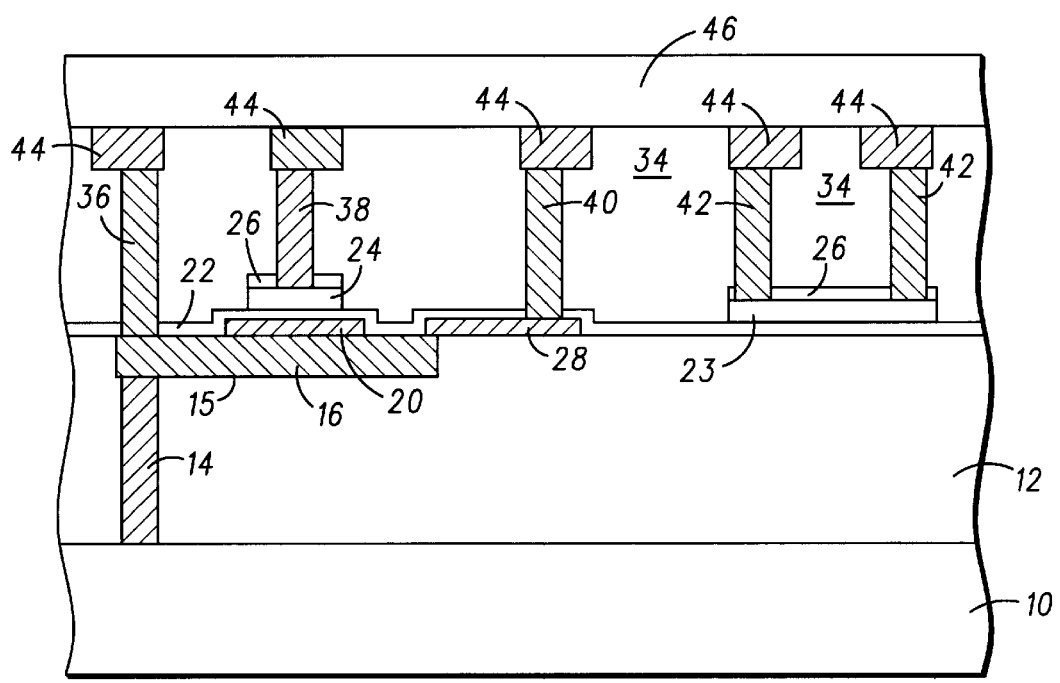
FIG. 2 illustrates a capacitor and resistor fabricated in accordance with the present invention.

FIG. 2 also illustrates a combination of semiconductor passive elements such as a metal-insulator-metal capacitor and thin film resistors. It should be noted that the same reference numbers are used in the figures to denote the same elements. An insulating dielectric layer 12 is formed over semiconductor substrate 10 and a portion of the dielectric layer etched to define a trench 15 therein. A via 14 is etched from a bottom surface of trench 15 through insulating dielectric layer 12 to semiconductor substrate 10. A metal layer 16 fills trench 15 and via 14 with a conductive material that provides electrical contact between substrate 10 and metal layer 16.

A bottom capacitor electrode layer 20 is formed over at least a portion of metal layer 16. A resistor 28 is formed from the same material that forms bottom capacitor electrode layer 20. Resistor 28 is formed on insulating dielectric layer 12 and may be contacted from metal layer 16. A dielectric layer 22 is deposited over bottom capacitor electrode layer 20 and resistor 28 and is also used as the dielectric layer for the capacitor. A top capacitor electrode layer 24 adjoins at least a portion of capacitor dielectric layer 22. The top capacitor electrode layer 24 optionally may include an etch stop layer 26 over at least a portion of its surface. The combination of capacitor electrode layer 20, capacitor dielectric layer 22, and capacitor electrode layer 24, and optional etch stop layer 26 if used, defines the structure of the capacitor element shown in this embodiment.

A dielectric layer 34 covers the capacitor and resistors 28 and 23. Terminals of resistors 28 and 23 can be contacted from above by forming respective vias 40 and 42 in dielectric layer 34 and filling the vias with a metal layer 44. Optionally, resistor 28 can be contacted from below through metal layer 16 and the metal filled via 14. It should be noted that in this embodiment, resistors 28 and 23 may be formed from materials having different resistivity values. It should be further noted that the material used to form capacitor electrode layer 24 is deposited in the same processing step that forms resistor 23.

Optionally, capacitor electrode layer 20 can be eliminated and metal layer 16 used to form an electrode of the capacitor. In this embodiment (not shown), the combination of metal layer 16, capacitor dielectric layer 22, and capacitor electrode layer 24, define the structure of the capacitor element. When capacitor electrode layer 20 is not used, resistive elements that include resistor 23 are available.

By now it should be appreciated that devices prepared in accordance with the present invention find practical application in any of a variety of stationary or portable systems, such as (without limitation) radio frequency systems, systems having analog circuits or mixed signal applications. For instance, systems such as wireless communications equipment systems (e.g., pagers, phones, internet access devices, computing systems, networking systems, television or radio broadcast systems, positioning systems, one or two way communications or other radio frequency communications systems) employing the present devices are contemplated as within the scope of the present invention. Such systems benefit from improved performance using the devices and methods of the present invention, particularly in view of the ability to integrate one or more passive elements into separate chips or modules or onto active substrates.

What is claimed is:

1. A method for fabricating a semiconductor device, comprising the steps of:
    providing a semiconductor substrate;
    forming an insulating layer on the semiconductor substrate;
    forming a first damascene metal layer in the insulating layer for electrical communication with the semiconductor substrate;
    forming a capacitor on the first damascene metal layer, the capacitor having a first capacitor electrode and a second capacitor electrode;
    forming at least one resistor on the first damascene metal layer, wherein the at least one resistor is formed from a same layer of material as used in forming the first capacitor electrode; and
    forming a second metal layer for electrical communication with the capacitor.

2. The method of claim 1, wherein the metal of the first damascene metal layer is selected from copper, gold, silver or mixtures thereof.

3. The method of claim 1, wherein the forming a first damascene metal layer step includes depositing copper in a trench in the insulating layer and chemically polishing the copper to define a surface that is substantially coplanar with a surface on the insulating layer.

4. The method of claim 1, wherein the at least one resistor is at least partially formed on a dielectric layer that overlies the first damascene metal layer.

5. The method of claim 1, further comprising the step of forming an additional resistor, the additional resistor being formed from a same layer of material as used in forming the second capacitor electrode.

6. The method of claim 1, further comprising the step of forming an additional resistor from a third metal layer which is a different layer than that used to form either of the first and second capacitor electrodes.

7. The method of claim 1, wherein the second metal layer also provides for electrical communication with the at least one resistor.

8. A method for fabricating a semiconductor device, comprising the steps of:
    depositing a layer of copper into a trench defined in a flat surface of an insulating layer;
    forming a surface on the layer of copper that is coplanar with the flat surface of the insulating layer;
    forming a resistor on the layer of copper, wherein the resistor is formed directly on and contiguous with the copper layer over at least a portion of its surface; and
    forming a capacitor on the layer of copper, the capacitor having a first capacitor electrode and a second capacitor electrode;
    wherein the first capacitor electrode and the resistor are formed of a same layer of material.

9. The method according to claim 8 wherein the formed surface is damascene.

10. The method according to claim 8 further comprising forming a capacitor on the layer of copper, the capacitor having a first capacitor electrode and a second capacitor electrode, and wherein the first capacitor electrode and the resistor are formed of a same layer of material.

11. The method according to claim 8 further comprising the step of forming a dielectric layer on the resistor, wherein the dielectric layer forms a capacitor dielectric layer of the capacitor.

12. The method according to claim 11 further comprising the step of forming a contact in the dielectric layer to enable electrical communication with the resistor.

13. The method of claim 8 further comprising a dielectric layer that overlies at least a portion of the surface of the copper layer, and wherein the resistor is formed at least partially on the dielectric layer.

14. A method for fabricating a semiconductor, comprising the steps of:
    forming a damascene copper layer;

forming a dielectric layer on the damascene copper layer;

patterning an opening in the dielectric layer to expose a portion of the damascene copper layer;

forming a capacitor which at least in part lies over the dielectric layer and wherein at least a portion of a bottom electrode of the capacitor is in direct contact with the damascene copper layer through the opening in the dielectric layer; and, forming a resistor from a same layer of material as the bottom electrode of the capacitor.

15. The method of claim 14, wherein the capacitor includes a layer of material selected from $Ta_2O_5$, $SrTiO_3$, $ZrO_2$, $HfO_2$, $HfSiO_4$, $TiO_2$, $Si_3N_4$ or mixtures thereof and stoichiometric variations.

16. The method of claim 14, wherein the capacitor includes a layer of material selected from TaN, TaAlN, TiWN, CrNi, CrSi and mixtures thereof and stoichiometric variations.

17. A method of fabricating a semiconductor device, comprising the steps of:

providing a substrate;

forming an insulating layer on the substrate;

forming a damascene metal layer in the insulating layer for electrical communication with the semiconductor substrate;

depositing a first material on the damascene metal layer;

patterning the first material to form a first capacitor electrode and a first resistor;

depositing a dielectric layer over the first capacitor electrode and over the first resistor;

depositing a second material over the dielectric layer and over the first capacitor electrode; and patterning the second material to form a second capacitor electrode over the first capacitor electrode.

18. The method of claim 17 wherein the step of patterning the second material comprises, patterning the second material to also form a second resistor.

19. The method of claim 17, wherein the dielectric layer includes a layer of material selected from $Ta_2O_5$, $SrTiO_3$, $ZrO_2$, $HfO_2$, $HfSiO_4$, $TiO_2$, $Si_3N_4$ or mixtures thereof and stoichiometric variations.

20. The method of claim 17, wherein the damascene metal layer is a metal layer comprising copper.

21. The method of claim 17 wherein the first material is selected from TaN, TaAlN, TiWN, CrNi, CrSi and mixtures thereof and stoichiometric variations.

22. The method of claim 17 wherein the first and second materials are selected from TaN, TaAlN, TiWN, CrNi, CrSi and mixtures thereof and stoichiometric variations.

* * * * *